(12) United States Patent
Choi et al.

(10) Patent No.: US 12,733,527 B2
(45) Date of Patent: Sep. 8, 2026

(54) APPARATUS FOR BONDING CLIP, METHOD OF BONDING CLIP, AND SEMICONDUCTOR PACKAGE INCLUDING SEMICONDUCTOR CHIP TO WHICH CLIP IS BONDED USING THE METHOD

(71) Applicant: JMJ Korea Co., Ltd., Busan (KR)

(72) Inventors: Yun Hwa Choi, Busan (KR); Ji Won Choi, Busan (KR)

(73) Assignee: JMJ Korea Co., Ltd., Busan (KR)

( * ) Notice: Subject to any disclaimer, the term of this patent is extended or adjusted under 35 U.S.C. 154(b) by 337 days.

(21) Appl. No.: 18/617,495

(22) Filed: Mar. 26, 2024

(65) Prior Publication Data

US 2024/0379612 A1 Nov. 14, 2024

(30) Foreign Application Priority Data

May 8, 2023 (KR) ........................ 10-2023-0059216

(51) Int. Cl.

*H10W 72/00* (2026.01)
*H10W 72/60* (2026.01)
*H10W 90/00* (2026.01)

(52) U.S. Cl.

CPC .... *H10W 72/0711* (2026.01); *H10W 72/0198* (2026.01); *H10W 72/076* (2026.01); *H10W 72/60* (2026.01); *H10W 72/01651* (2026.01); *H10W 72/07163* (2026.01); *H10W 72/07168* (2026.01); *H10W 72/07183* (2026.01); *H10W 72/07611* (2026.01); *H10W 72/07631* (2026.01); *H10W 90/766* (2026.01)

(58) Field of Classification Search

None
See application file for complete search history.

(56) References Cited

U.S. PATENT DOCUMENTS

2024/0153838 A1* 5/2024 Yandoc .............. H10W 70/481

FOREIGN PATENT DOCUMENTS

| | | | |
|---|---|---|---|
| CN | 112838024 | A | 5/2021 |
| KR | 10-1245383 | B1 | 3/2013 |
| KR | 10-1612730 | B1 | 4/2016 |
| KR | 10-1949334 | B1 | 2/2019 |
| KR | 10-2098337 | B1 | 4/2020 |
| KR | 10-2022-0167484 | A | 12/2022 |

* cited by examiner

*Primary Examiner* — Anthony Ho
(74) *Attorney, Agent, or Firm* — Park, Kim & Suh, LLC

(57) ABSTRACT

The present invention relates to an apparatus for bonding clips, a method of bonding clips, and a semiconductor package including semiconductor chips to which the clips are bonded using the method, and more particularly, to an apparatus for bonding clips, a method of bonding clips, and a semiconductor package including semiconductor chips to which the clips are bonded using the method, wherein the clips are sequentially bonded to the semiconductor chips by 1 unit so that a pitch difference between a lead frame array and a clip array is separately corrected to be the same and thereby, misalignment may be minimized so as to increase bonding accuracy of the clips to the semiconductor chips.

20 Claims, 12 Drawing Sheets

APPARATUS FOR BONDING CLIP, METHOD OF BONDING CLIP, AND SEMICONDUCTOR PACKAGE INCLUDING SEMICONDUCTOR CHIP TO WHICH CLIP IS BONDED USING THE METHOD

CROSS-REFERENCE TO RELATED PATENT APPLICATION

This application claims the benefit of Korean Patent Application No. 10-2023-0059216, filed on May 8, 2023, in the Korean Intellectual Property Office, the disclosure of which is incorporated herein in its entirety by reference.

BACKGROUND OF THE INVENTION

1. Field of the Invention

The present invention relates to an apparatus for bonding clips, a method of bonding clips, and a semiconductor package including semiconductor chips to which the clips are bonded using the method, and more particularly, to an apparatus for bonding clips, a method of bonding clips, and a semiconductor package including semiconductor chips to which the clips are bonded using the method, wherein the clips are sequentially bonded to the semiconductor chips by 1 unit so that a pitch difference between a lead frame array and a clip array is separately corrected to be the same and thereby, misalignment may be minimized so as to increase bonding accuracy of the clips to the semiconductor chips.

2. Description of the Related Art

Generally in a high-voltage and high-current semiconductor package which realizes power semiconductor devices, a bonding wire may be replaced with a conductive clip having excellent electrical properties and thermal properties. In order to bond clips to a semiconductor chip, the clips are aligned on the semiconductor chip and are bonded to the semiconductor chip.

For example, in order to electrically connect a semiconductor chip to a lead frame by using clips, the semiconductor chip is placed on the upper part of the lead frame (lead frame pad), the semiconductor chip is bonded and installed to the lead frame by using an adhesive, and then, the clips are placed at appropriate positions on the semiconductor chip and are each bonded to the semiconductor chip and the lead frame (lead frame lead).

In this regard, for such a clip bonding process, the lead frame to which the semiconductor chip is bonded needs to be placed on a right position for clip bonding and to be aligned within an allowable range of error so that a defect rate of products may be minimized.

Meanwhile, a plurality of clips may be respectively aligned on a plurality of semiconductor chips, and a pitch of the clips and a pitch of the lead frame to which the semiconductor chips are installed may be matched so that the clips may be simultaneously bonded through a method of bonding multiple clips. The simultaneous bonding of the clips may be reasonable in terms of effectiveness, however, a different pitch may not be corrected if a pitch of the clips and a pitch of the lead frame are not matched.

Accordingly, there is a demand for the technology that may sequentially bond clips to a semiconductor chip by 1 unit and thereby, may separately and equally correct a pitch difference between a lead frame and a clip.

SUMMARY OF THE INVENTION

The present invention provides an apparatus for bonding clips, a method of bonding clips, and a semiconductor package including semiconductor chips to which the clips are bonded using the method, wherein the clips are sequentially bonded to the semiconductor chip by 1 unit so that a pitch difference between a lead frame array and a clip array is separately corrected to be the same and thereby, misalignment may be minimized so as to increase bonding accuracy of the clips to the semiconductor chip.

According to an aspect of the present invention, there is provided an apparatus for bonding clips including: a lead frame array including lead frames, to which at least one semiconductor chip is to be bonded, are arranged and spaced apart from each other by X1 and Y1 pitch interval in an X-axis direction and an Y-axis direction; a clip array including a plurality of clips and tie bars, wherein the plurality of clips is arranged and spaced apart from each other by X2 and Y2 pitch interval which is smaller than any one of X1 and Y1 pitch interval in an X-axis direction and an Y-axis direction and the tie bars connect each of the plurality of clips; a punch member including at least two punches and punch holders, wherein the at least two punches separate the plurality of clips into at least two individual clips by cutting the tie bars and the punch holders hold the punches; a die member including at least two die holes and withdrawal guiding units, wherein the at least two die holes guide punching of the punches and the withdrawal guiding units are formed to face the inner wall surface of the die hole and are opened at a fixed angle from the lower inner wall surface, where the punches are entered, toward the upper inner wall surface; and a clip picker member including a multi-picker head and a picker holder, wherein the multi-picker head includes a plurality of picker heads which respectively vacuum adsorbs individual clip separated by being entered to the die holes and vacuum releases the individual clip to be bonded to the semiconductor chips on the lead frame and the picker holder holds the multi-picker head so that at least two individual clips bonded to the picker heads are sequentially bonded to the upper surface of the semiconductor chip.

Here, the individual clip may be sequentially bonded according to X1 and Y1 pitch interval of the lead frames, when the individual clip is bonded by the clip picker member.

Also, the punches and the die member may be formed of Tungsten Carbide (TC) or SKD 11.

Also, the punches and the die member may have a hardness values that is greater than a hardness value of the clips.

Also, the clip array may further include a clip loading unit which winds the clip array in a reel form and provides the clip array by being arranged on punching positions by the punch member.

Also, the clips may be formed of a material containing 60% or more of Cu or 50% or more of Al.

Also, unit per hour UPG of clip bonding performed by the clip picker member may be above 20,000.

Also, the picker heads may vertically fall down to the die holes to vacuum adsorb the individual clip, move onto the lead frame array, and vertically fall down to mount the individual clip on the upper surface of the semiconductor chips.

Here, the clip picker member may move the individual clip from the die member to the lead frame array by motor driving.

Also, the front end of the picker heads may be entered from the upper part of the die holes and vacuum adsorb and bond the individual clip.

Also, the apparatus may further include a vision camera to identify bonding of the semiconductor chips and the individual clip.

Also, the plurality of clips may be arranged by at least two columns on the clip array.

Also, a burr direction generated on the individual cut clip may be formed toward the lead frames, when the tie bars are cut by the punches.

Also, the front surface of the picker head, to which the clip is adsorbed, may include at least one vacuum hole.

Also, the die holes may be formed on and penetrate the die in a hexahedral form and the withdrawal guiding units may be protruded and face the inner wall surface which corresponds to a long side of the die hole.

According to another aspect of the present invention, there is provided a method of bonding clips including: preparing a lead frame array including the lead frames, wherein the lead frames, to which at least one semiconductor chip is to be bonded, are arranged and spaced apart from each other by X1 and Y1 pitch interval in an X-axis direction and an Y-axis direction; preparing a clip array including a plurality of clips and the tie bars, wherein the plurality of clips is arranged and spaced apart from each other by X2 and Y2 pitch interval which is smaller than any one of X1 and Y1 pitch interval in an X-axis direction and an Y-axis direction and the tie bars connect each of the plurality of clips; separating the plurality of clips into at least two individual clips using a punch member by cutting the tie bars, wherein the punch member includes at least two punches and punch holders that hold the punches; guiding punching of the punches and accommodating the separated individual clip by using the die member, wherein the die member includes at least two die holes and withdrawal guiding units which are formed to face the inner wall surface of the die hole and are opened at a fixed angle from the lower inner wall surface, where the punches are entered, toward the upper inner wall surface; and bonding the at least two individual clips attached to the picker heads sequentially to the upper surface of the semiconductor chips by using the clip picker member, wherein the clip picker member includes a multi-picker head including a plurality of picker heads and a picker holder that holds the multi-picker head and thereby, respectively vacuum adsorbs individual clip separated by being entered to the die holes and vacuum releases the individual clip to the semiconductor chips on the lead frame.

Here, the individual clip may be sequentially bonded according to X1 and Y1 pitch interval of the lead frames, when the individual clip is bonded by the clip picker member.

Also, the picker heads may vertically fall down to the die holes to vacuum adsorb the individual clip, move onto the lead frame array, and vertically fall down to mount the individual clip on the upper surface of the semiconductor chips.

Also, a burr direction generated on the individual cut clip may be formed toward the lead frames, when the tie bars are cut by the punches.

Also, the die holes may be formed on and penetrate the die in a hexahedral form and the withdrawal guiding units may be protruded and face the inner wall surface which corresponds to a long side of the die hole.

According to another aspect of the present invention, there is provided a semiconductor package including semiconductor chips to which clips are bonded by using the method of bonding clips described above.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
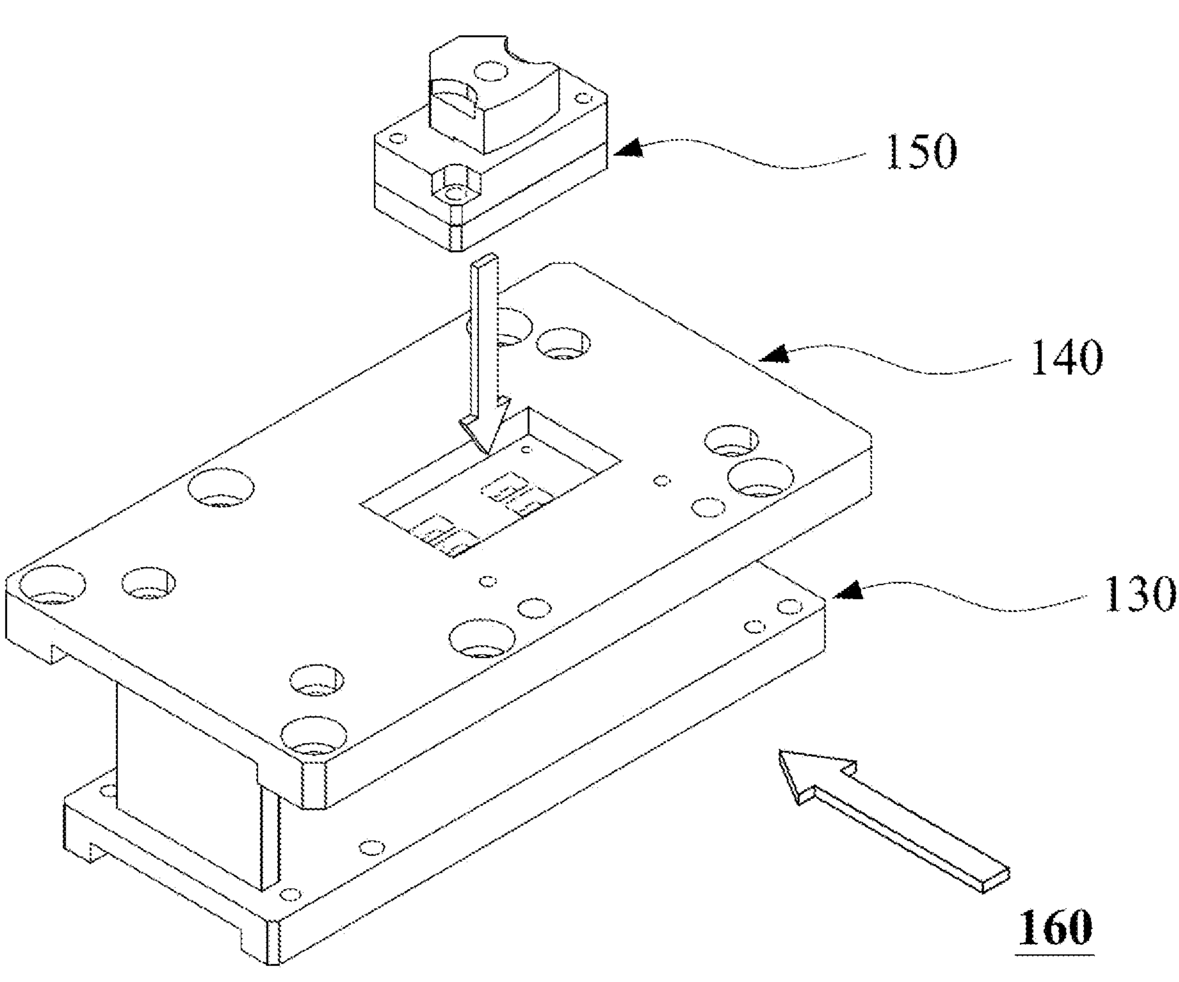
FIG. 1 illustrates an apparatus for bonding clips according to an embodiment of the present invention.

Hereinafter, embodiments of the present invention will be described in more detail with reference to the accompanying drawings.

An apparatus for bonding clips according to an embodiment of the present invention includes a lead frame array 110 including lead frames 111, a clip array 120 including a plurality of clips 121 and tie bars 122, a punch member 130 including at least two punches 131 and punch holders 132, a die member 140 including at least two die holes 141 and withdrawal guiding units 142, and a clip picker member 150 including a multi-picker head and a picker holder 152, wherein the lead frames 111, to which at least one semiconductor chip 10 is to be bonded, are arranged and spaced apart from each other by X1 and Y1 pitch interval (X1, Y1) in an X-axis direction and an Y-axis direction, the plurality of clips 121 is arranged and spaced apart from each other by X2 and/or Y2 pitch interval (X2, Y2) which is smaller than X1 and/or Y1 pitch interval (X1, Y1) in an X-axis direction and an Y-axis direction and the tie bars 122 connect each of the plurality of clips 121, the at least two punches 131 separate the plurality of clips 121 into at least two individual clips 121 by cutting the tie bars 122 and the punch holders 132 hold the punches 131, the at least two die holes 141 guide punching of the punches 131 and the withdrawal guiding units 142 are formed to face the inner wall surface of the die hole 141 and are opened at a fixed angle from the lower inner wall surface, where the punches 131 are entered, toward the upper inner wall surface, the multi-picker head includes a plurality of picker heads 151 which respectively vacuum adsorbs individual clip 121 separated by being entered to the die holes 141 and vacuum releases the individual clip 121 to be bonded to the semiconductor chips 10 on the lead frame

111, and the picker holder 152 holds the multi-picker head so that at least two individual clips 121 bonded to the picker heads 151 are sequentially bonded to the upper surface of the semiconductor chip 10. Accordingly, the individual clip 121 may be sequentially bonded to the semiconductor chip 10 by 1 unit.

Hereinafter, the apparatus for bonding clips as above will be described in more detail with reference to FIGS. 1 through 10.

Figure 8:
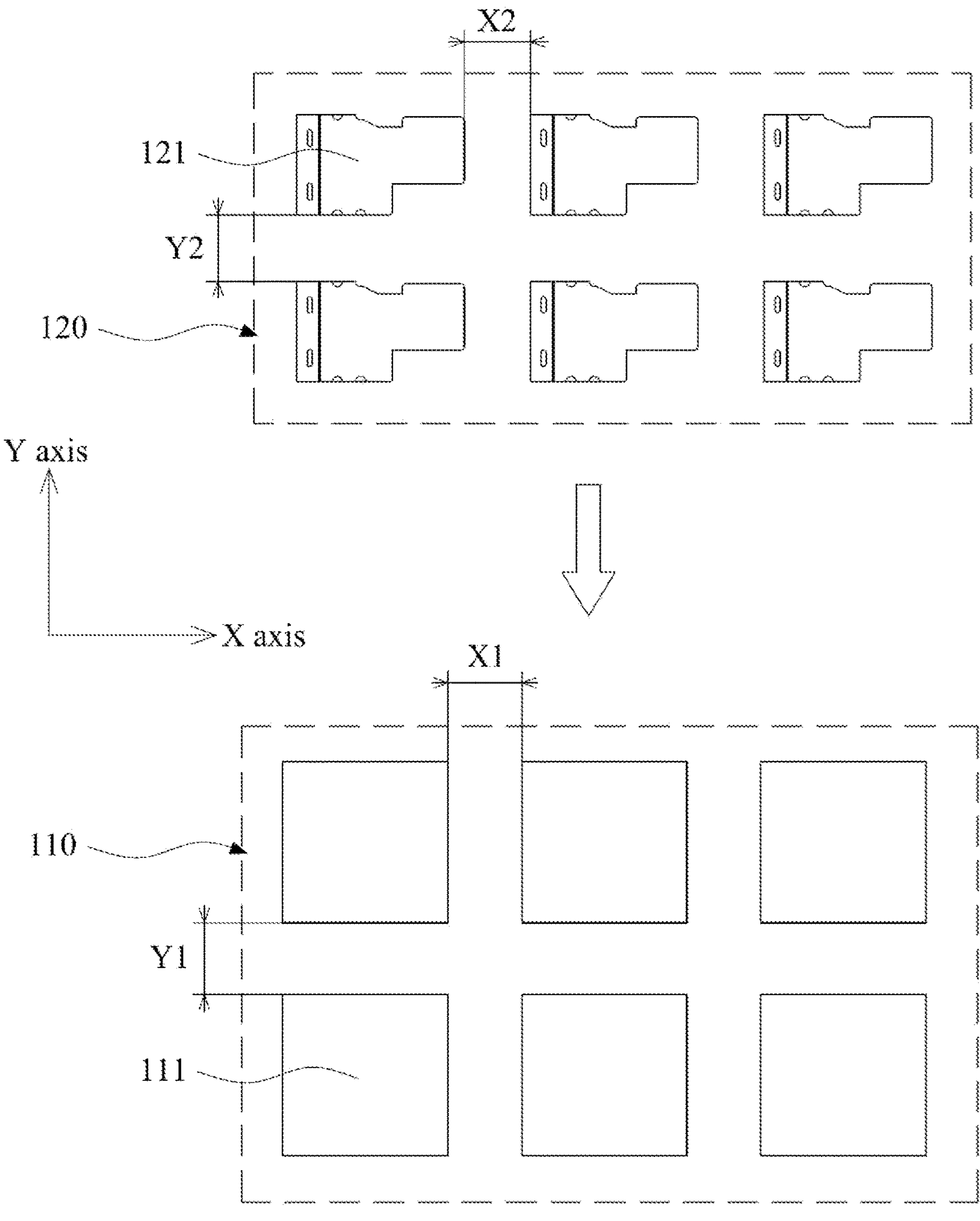
FIG. 8 respectively illustrates pitch intervals of a lead frame array and a clip array in the apparatus for bonding clips of FIG. 1.
Figure 10:
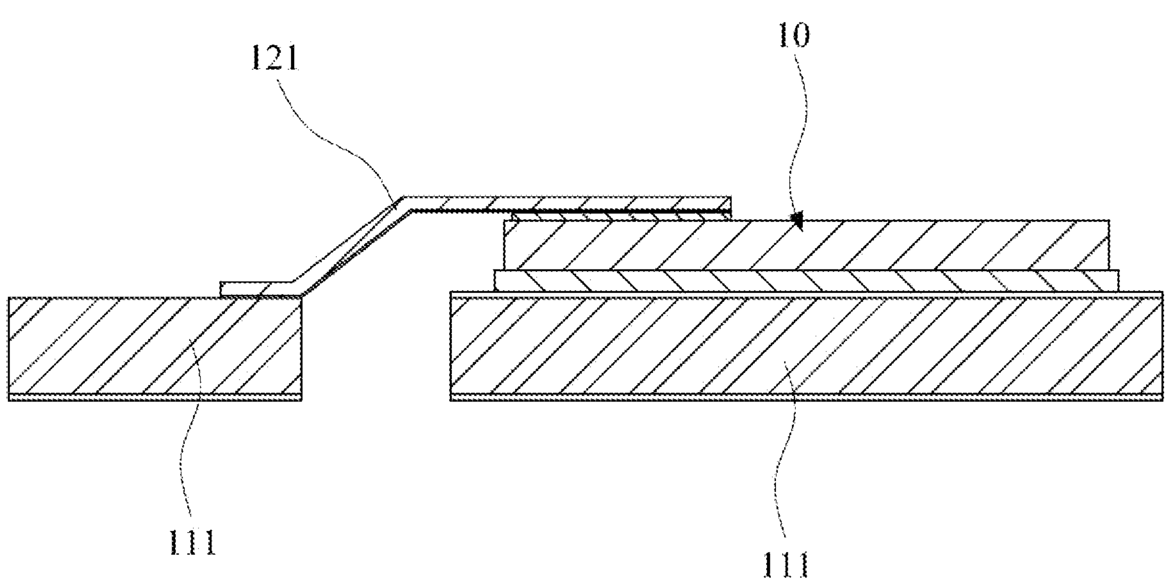
FIG. 10 illustrates a bonding structure of a clip and a semiconductor chip performed by the apparatus for bonding clips of FIG. 1.

First, referring to FIGS. 8 and 10, the lead frame array 110 includes the lead frames 111, wherein the lead frames 111, to which the plurality of semiconductor chips 10 is to be bonded, are arranged and spaced apart from each other by X1 and Y1 pitch interval (X1, Y1) in an X-axis direction and an Y-axis direction and are arranged in a matrix form.

Also, the lead frame array 110, to which the semiconductor chips 10 are bonded, is transferred to a clip bonding unit (not illustrated).

Here, the semiconductor chip 10 may be a MOSFET semiconductor or an IGBT semiconductor. However, the present invention is not limited thereto and the semiconductor chip 10 may be a silicon control rectifier SCR, a power transistor, a power rectifier, a power regulator, or a power semiconductor including a combination thereof.

Figure 9:
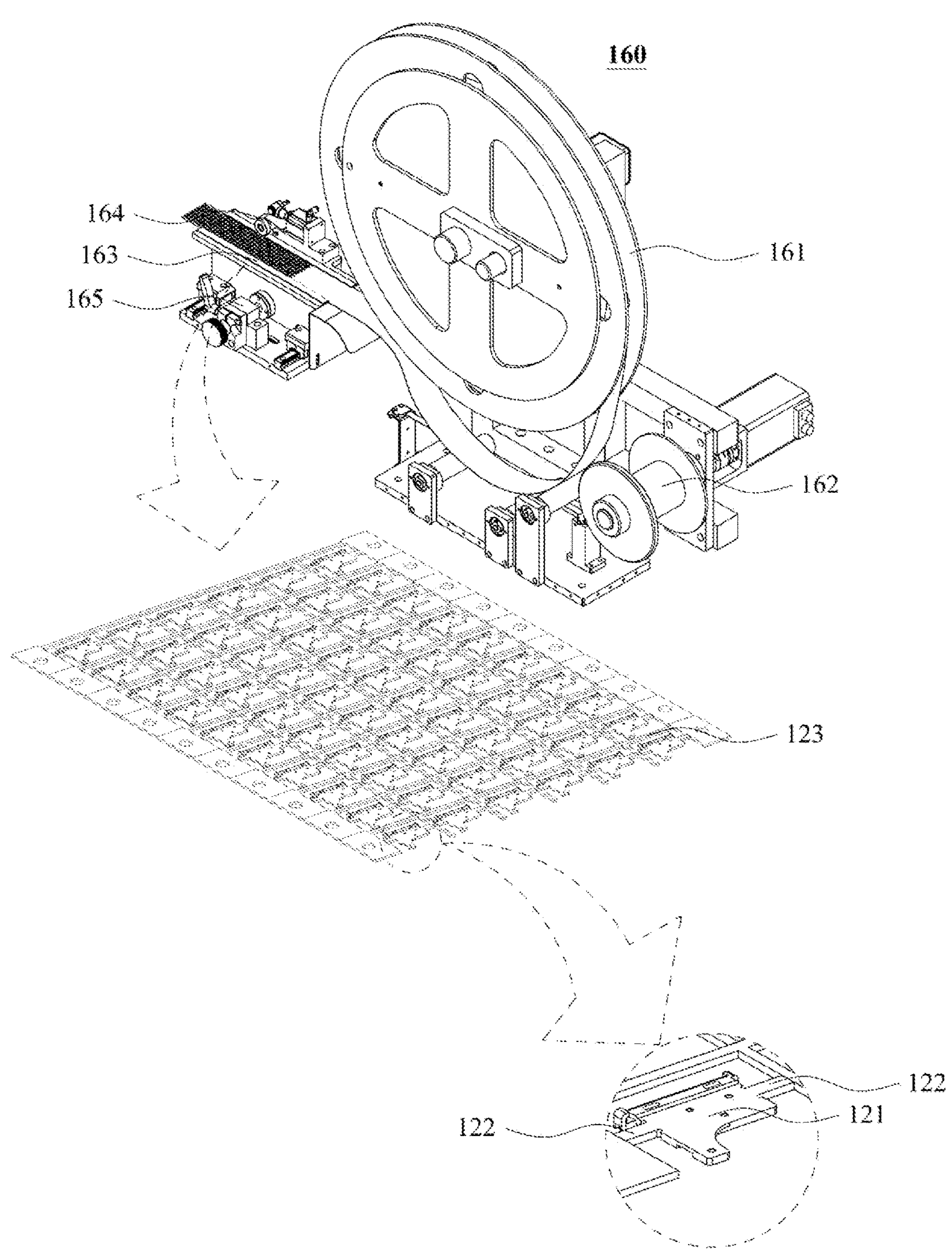
FIG. 9 illustrates a clip loading member and a clip array in the apparatus for bonding clips of FIG. 1.

Next, referring to FIGS. 8 through 10, the clip array 120 includes the plurality of clips 121, the tie bars 122, and clip frames 123, wherein the plurality of clips 121 is arranged and spaced apart from each other by X2 and/or Y2 pitch interval (X2, Y2) which is smaller than X1 and/or Y1 pitch interval (X1, Y1) in an X-axis direction and an Y-axis direction and is formed of a conductive metal material arranged in a matrix form and the tie bars 122 are connecting dummy that connects each of the plurality of clips 121 and are connected to the clip frames 123.

Figure 12:
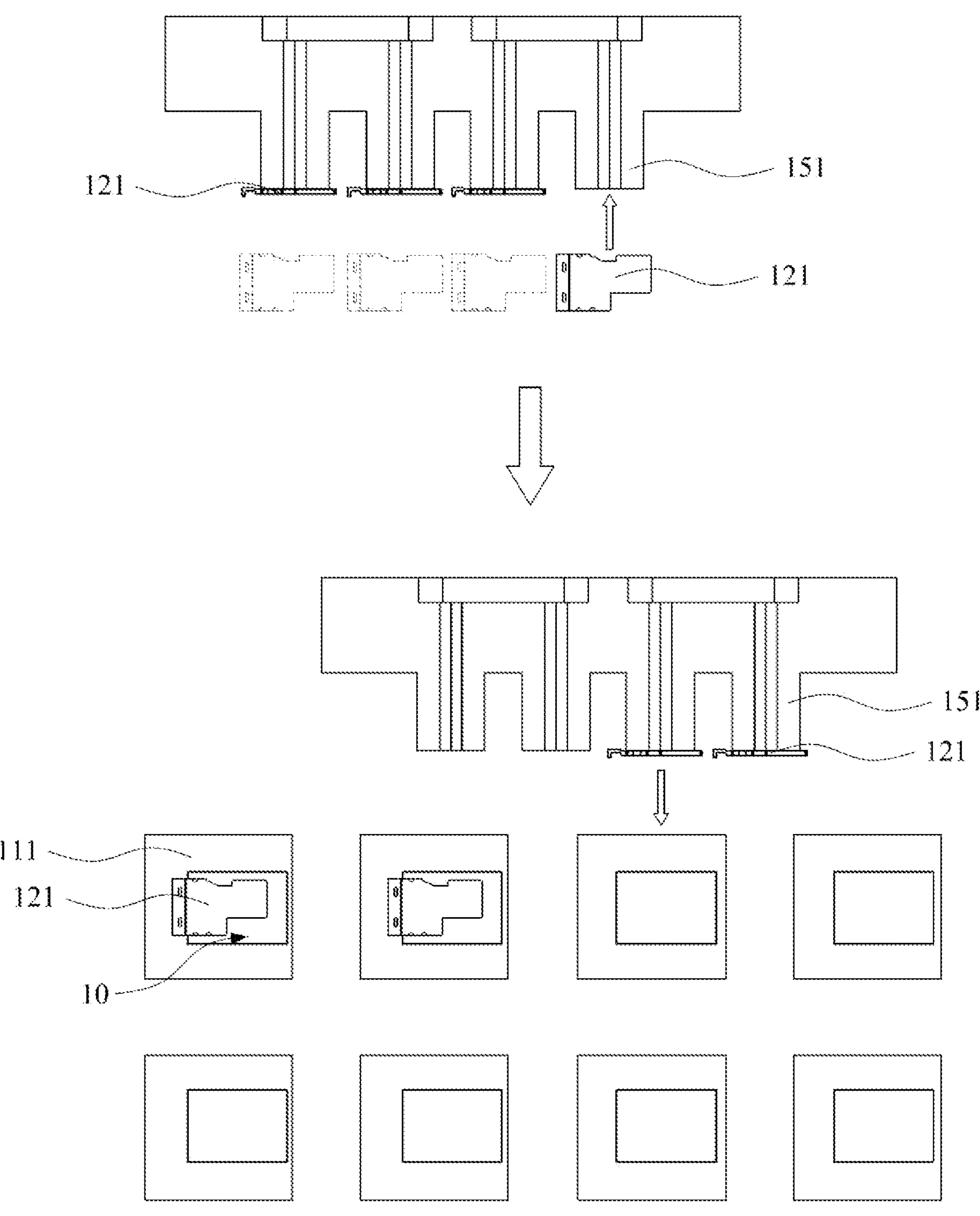
FIG. 12 illustrates clip adsorption and clip bonding performed by the method of bonding clips of FIG. 11.

Here, as illustrated in FIGS. 8 and 12, when the clips 121 are bonded by the clip picker member 150, individual clip 121 may be sequentially bonded according to X1 and/or Y1 pitch interval (X1, Y1) of the lead frames 111.

That is, although the clips 121 are sequentially bonded to the semiconductor chips 10 by 1 unit and thereby, the lead frame array 110 and the clip array 120 have each different pitch, bonding accuracy of the individual clip 121 to the semiconductor chips 10 may be increased.

Also, unit per hour UPG of clip bonding performed by the clip picker member 150 may be above 20,000. Accordingly, even if the individual clip 121 is sequentially bonded by 1 unit, a yield that is close to that of simultaneous bonding of multiple clips may be provided.

In addition, as illustrated in FIG. 9, the plurality of clips 121 may be arranged by at least two columns on the clip array 120.

Meanwhile, the clip array 120 is wound to a clip loading unit 160 in a reel form and is provided by being arranged on punching positions by the punch member 130.

For example, as illustrated in FIG. 9, the clip loading unit 160 may include a clip reel 161 to which the clip array 120 is wound, an interleaf paper reel 162 which removes interleaf paper from the clip array 120, a pair of clip guiding rails 163 which face each other and guide the clip array 120 from the clip reel 161 to the die member 140, a clip supply roller module 164 which transfers the clip array 120 to the die member 140 along the clip guiding rails 163, and a transfer width control module 165 which controls a width of the clip guiding rails 163 and controls a width of transferring the clip array 120.

Meanwhile, the clip array 120 may be provided in a reel form. However, the present invention is not limited thereto and the clip array 120 may be provided in a strip form.

Also, the clip 121 may be formed of a material containing 60% or more of Cu or 50% or more of Al and thereby, may have excellent electrical conductivity.

Next, the punch member 130 separates the clips 121 into individual clip 121 by punching. More specifically, referring to FIGS. 2 through 5, the punch member 130 includes the at least two punches 131 and the punch holders 132, wherein the at least two punches 131 cut the tie bars 122 and separate the clips 121 into at least two individual clips 121 from the clip frames 123 and the punch holders 132 hold each of the punches 131.

Here, when the tie bars 122 are cut by the punches 131, a burr direction generated on the individual cut clip 121 is formed toward the lead frames 111 so that a burr may be prevented from being protruded to the outside of the surface of a package while in a following package housing process.

Figure 2:
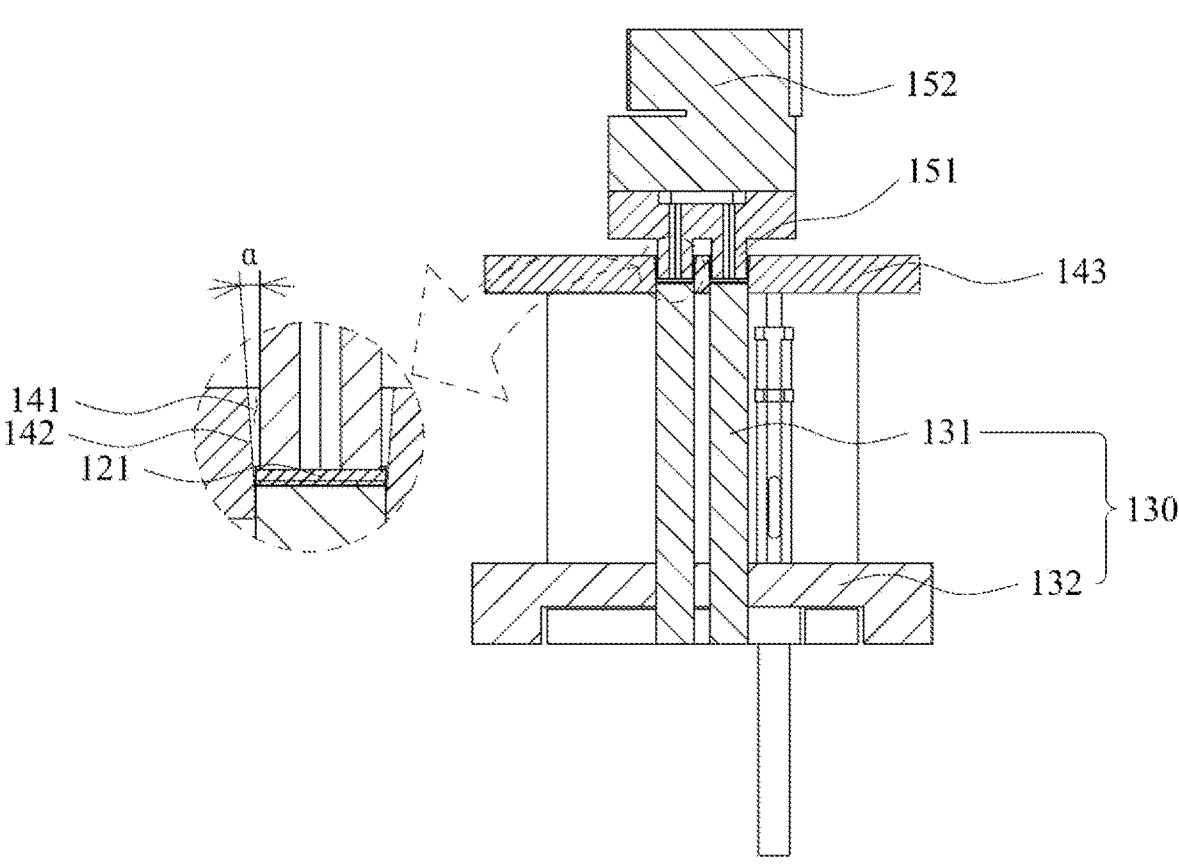
FIGS. 2 and 3 are cross-sectional views respectively illustrating the apparatus for bonding clips of FIG. 1.
Figure 3:
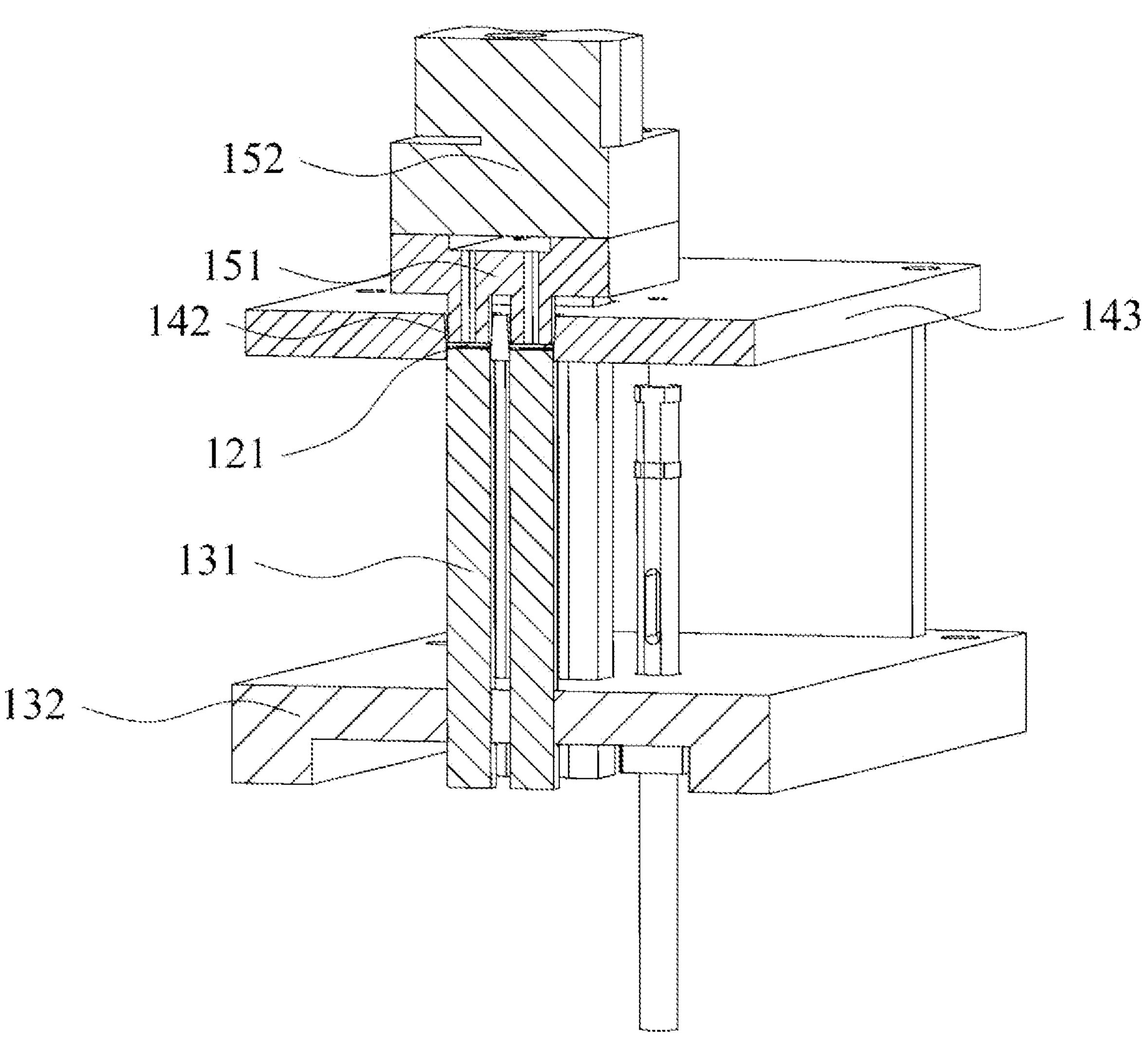
Figure 4:
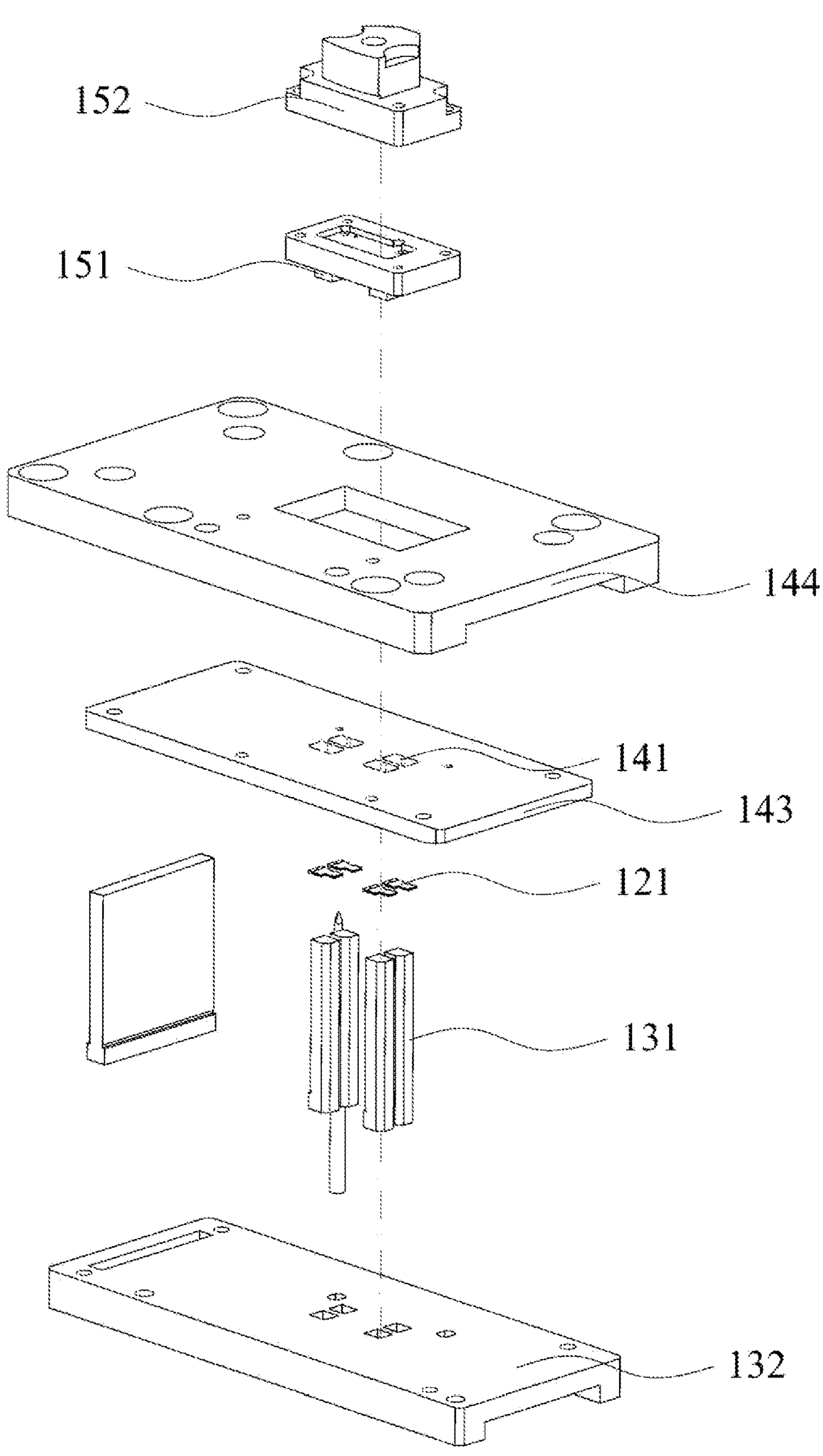
FIGS. 4 and 5 are exploded views respectively illustrating the apparatus for bonding clips of FIG. 1.

Next, as illustrated in FIGS. 1 through 5, the die member 140 includes the at least two die holes 141, the withdrawal guiding units 142, a die 143, and a die holder 144, wherein the at least two die holes 141 guide punching of the punches 131, the withdrawal guiding units 142 are formed to face the inner wall surface of the die hole 141 and are protruded and opened at a fixed angle, for example, 1° through 7° (($\alpha$) in FIG. 2), from the lower inner wall surface, where the punches 131 are entered, toward the upper inner wall surface, the die 143 includes the die holes 141 penetrated thereinto, and the die holder 144 holds the die 143.

As described above, the individual cut clip 121 may be withdrawn from the die holes 141 by the picker head 151 without any interference by using the withdrawal guiding units 142.

Figure 5:
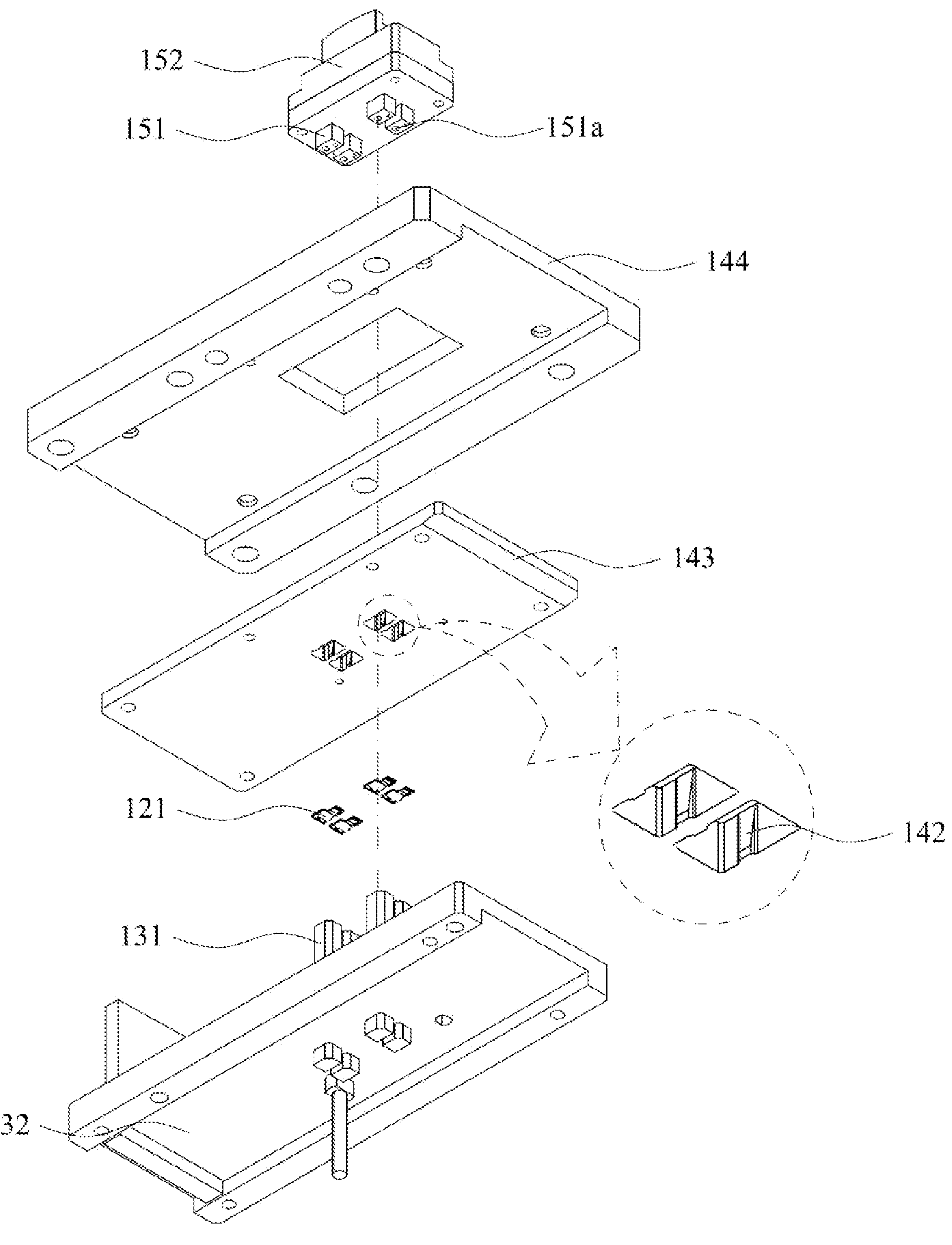
Figure 6:
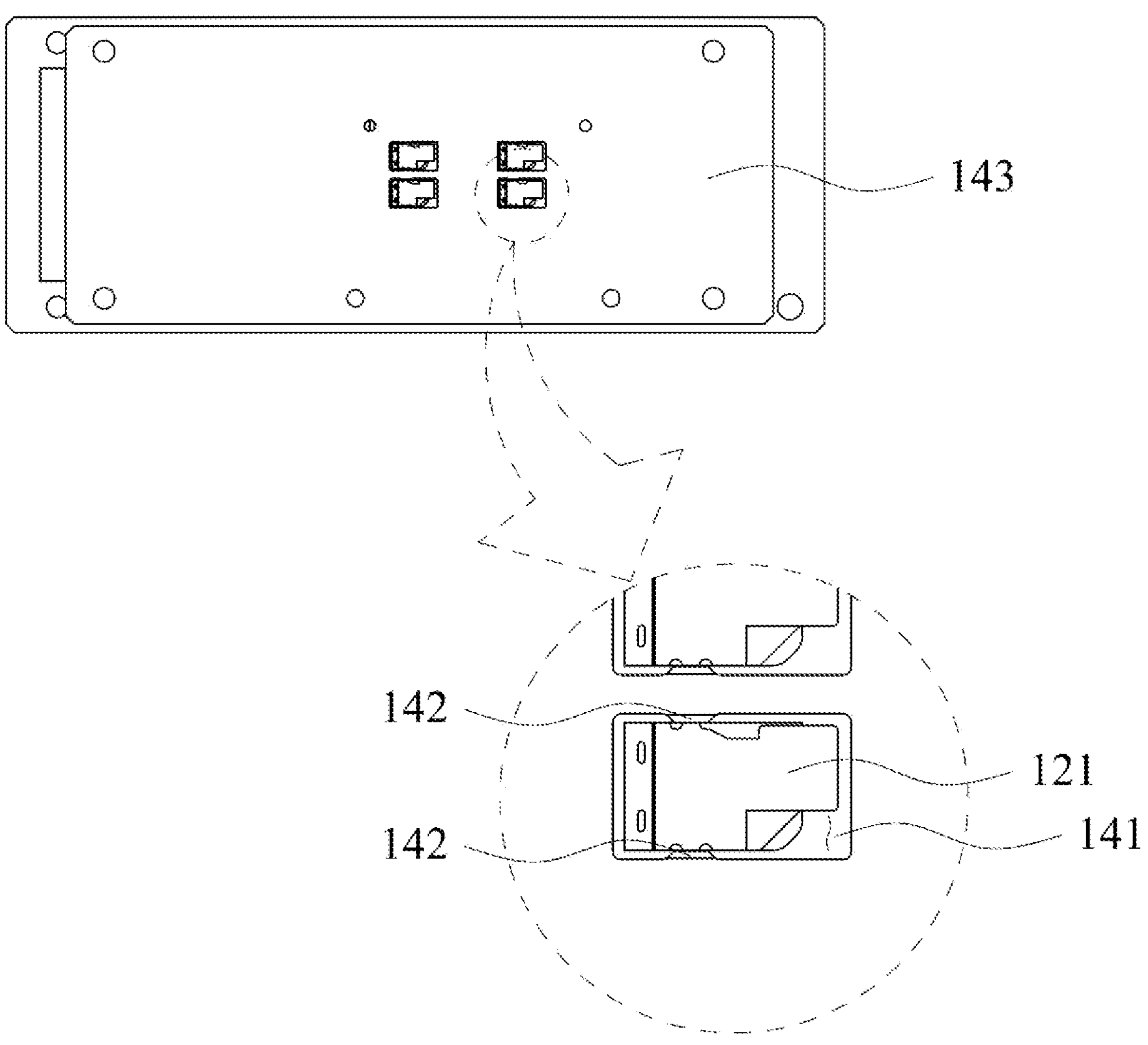
FIG. 6 is a plan view of a die member of FIG. 5.

For example, referring to FIGS. 5 and 6, the die holes 141 may be formed on and penetrate the die 143 in a hexahedral form and the withdrawal guiding units 142 may be protruded and face the inner wall surface which corresponds to a long side of the die hole 141.

Figure 7:
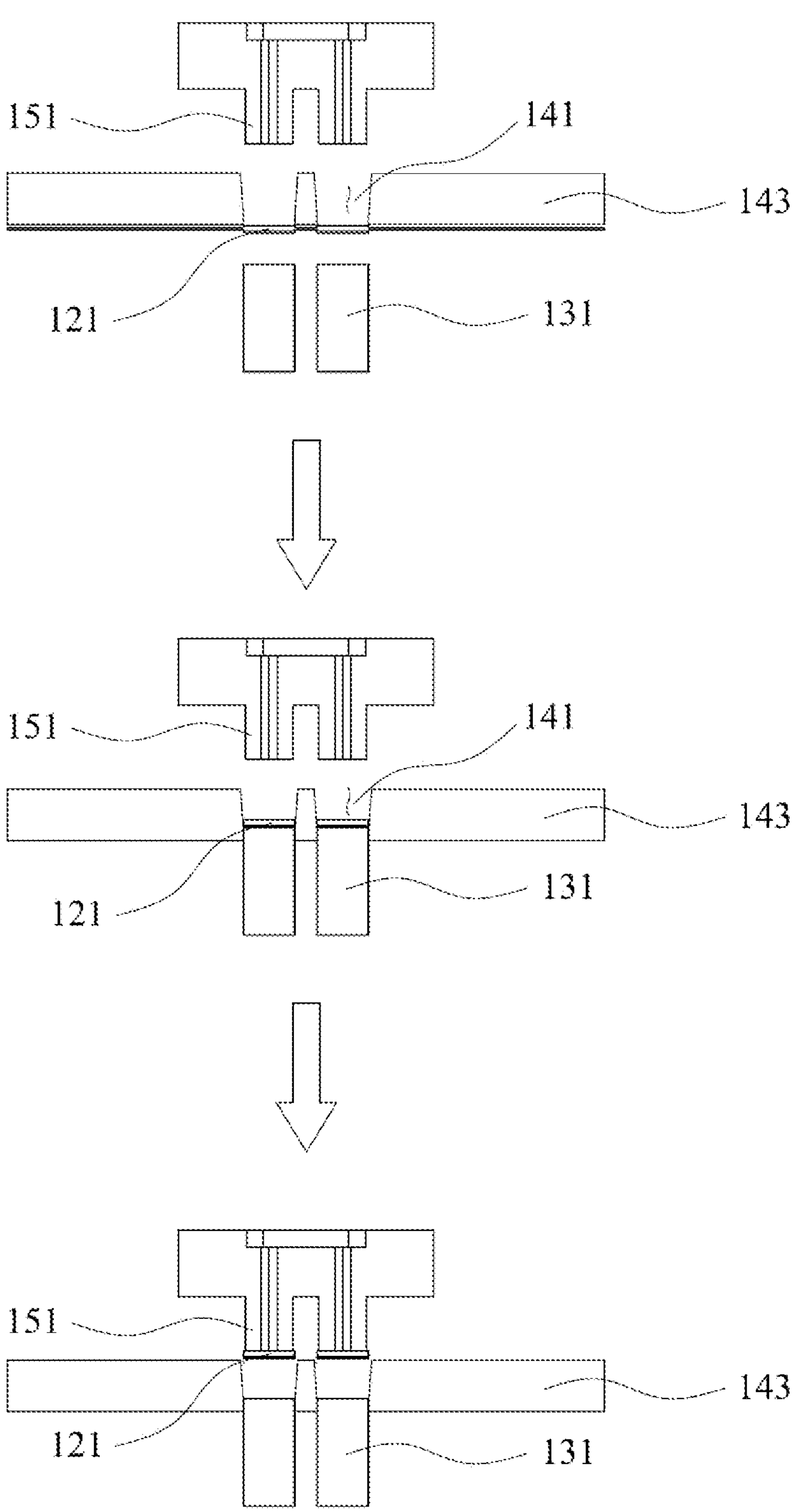
FIG. 7 illustrates clip cutting and vacuum adsorption in the apparatus for bonding clips of FIG. 1.

As illustrated in FIG. 7, according to the punch member 130 and the die member 140 described above, the punches 131 may be entered to the die holes 141, pressurize the tie bars 122, loaded between the punch member 130 and the die member 140, and cut and separate the clips 121 arranged in the die holes 141.

Here, the punches 131 and the die member 140 may be formed of Tungsten Carbide (TC) or SKD 11 which is a press mold material. Also, a hardness values of the punches 131 or the die member 140 is greater than a hardness value of the clips 121 so that the tie bars 122 may be easily cut and durability thereof may be improved.

Next, referring to FIGS. 1 through 5, the clip picker member 150 includes the multi-picker head and the picker holder 152, wherein the multi-picker head includes 3 to 50 picker heads 151 which respectively vacuum adsorb individual clip 121 separated by being entered to the die holes 141 and vacuum release the individual clip 121 to be bonded to the semiconductor chip 10 on the lead frame 111 and the picker holder 152 holds the multi-picker head.

Here, the clip picker member 150 may sequentially bond at least two individual clips 121 bonded to the picker heads 151 to the upper surface of the semiconductor chip 10.

Also, as illustrated in FIG. 7, the picker heads 151 may vertically fall down to the die holes 141 to vacuum adsorb the individual clip 121, move onto the lead frame array 110, and vertically fall down to mount the individual clip 121 on the upper surface of the semiconductor chips 10.

That is, the front end of the picker heads 151 may be entered from the upper part of the die holes 141 and may vacuum adsorb and bond the upper surface of the individual clip 121. Also, the front surface of the picker head 151, to which the individual clip 121 is adsorbed, may include at least one vacuum hole 151*a* (refer to FIG. 5).

Also, the clip picker member 150 may move the clips 121 from the die member 140 to the lead frame array 110 by motor driving.

In addition, a vision camera such as a flying vision camera and a step vision cameral may be used to identify whether the semiconductor chips 10 and the individual clip 121 are bonded or to examine an alignment state or misalignment between the semiconductor chips 10 and the individual clip 121 and between the lead frames 111 and the individual clip 121.

Figure 11:
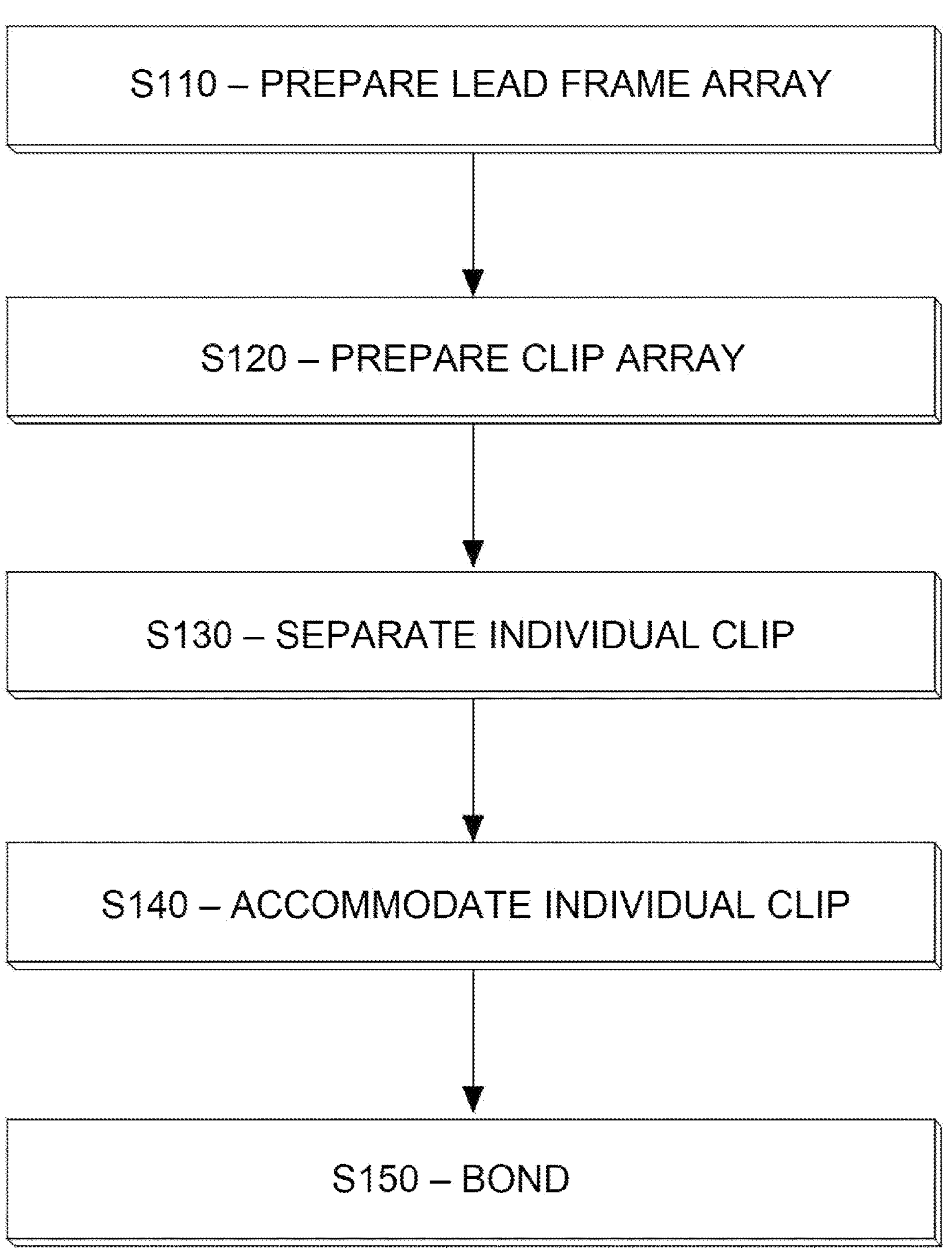
FIG. 11 is a flowchart illustrating a method of bonding clips according to another embodiment of the present invention.

Meanwhile, referring to FIG. 11, a method of bonding clips according to an embodiment of the present invention includes preparing the lead frame array 110 including the lead frames 111 in operation S110, preparing the clip array 120 including the plurality of clips 121 and the tie bars 122 in operation S120, separating the plurality of clips 121 into the at least two individual clips 121 using the punch member 130 by cutting the tie bars 122 in operation S130, guiding punching of the punches 131 and accommodating the separated individual clip 121 by using the die member 140 in operation S140, and bonding the at least two individual clips 121 attached to the picker heads 151 sequentially to the upper surface of the semiconductor chips 10 by using the clip picker member 150 in operation S150, wherein the lead frames 111, to which the at least one semiconductor chip 10 is to be bonded, are arranged and spaced apart from each other by X1 and Y1 pitch interval (X1, Y1) in an X-axis direction and an Y-axis direction, the plurality of clips 121 is arranged and spaced apart from each other by X2 and/or Y2 pitch interval (X2, Y2) which is smaller than X1 and/or Y1 pitch interval (X1, Y1) in an X-axis direction and an Y-axis direction and the tie bars 122 connect each of the plurality of clips 121, the punch member 130 includes the at least two punches 131 and the punch holders 132 that hold the punches 131, the die member 140 includes the at least two die holes 141 and the withdrawal guiding units 142 which are formed to face the inner wall surface of the die hole 141 and are opened at a fixed angle from the lower inner wall surface, where the punches 131 are entered, toward the upper inner wall surface, and the clip picker member 150 includes the multi-picker head including the plurality of picker heads 151 and the picker holder 152 that holds the multi-picker head and thereby, respectively vacuum adsorbs individual clip 121 separated by being entered to the die holes 141 and vacuum releases the individual clip 121 to the semiconductor chips 10 on the lead frame 111.

Here, as illustrated in FIGS. 8 and 12, when the clips 121 are bonded by the clip picker member 150, the individual clip 121 may be sequentially bonded according to X1 and/or Y1 pitch interval (X1, Y1) of the lead frames 111.

That is, although the clips 121 are sequentially bonded to the semiconductor chips 10 by 1 unit and thereby, the lead frame array 110 and the clip array 120 have each different pitch, bonding accuracy of the individual clip 121 to the semiconductor chips 10 may be increased.

Also, the picker heads 151 may vertically fall down to the die holes 141 to vacuum adsorb the individual clip 121, move onto the lead frame array 110, and vertically fall down to mount the individual clip 121 on the upper surface of the semiconductor chips 10.

In addition, when the tie bars 122 are cut by the punches 131, a burr direction generated on the individual cut clip 121 is formed toward the lead frames 111 so that a burr may be prevented from being protruded to the outside of the surface of a package while in a following package housing process.

Moreover, the die holes 141 may be formed on and penetrate the die 143 in a hexahedral form and the withdrawal guiding units 142 may be protruded and face the inner wall surface which corresponds to a long side of the die hole 141.

Meanwhile, a semiconductor package according to another embodiment of the present invention includes the semiconductor chips 10 to which the clips are bonded by using the method of bonding clips described above.

According to the embodiments of the present invention described above, the clips may be sequentially bonded to the semiconductor chips by 1 unit so that a pitch difference between the lead frame array and the clip array may be separately corrected to be the same and thereby, misalignment may be minimized so as to increase bonding accuracy of the clips to the semiconductor chips. Also, cut clips may be withdrawn from the die holes by the picker head without any interference by using the withdrawal guiding units of the die holes.

According to the present invention, the clips may be sequentially bonded to the semiconductor chips by 1 unit so that a pitch difference between the lead frame array and the clip array may be separately corrected to be the same and thereby, misalignment may be minimized so as to increase bonding accuracy of the clips to the semiconductor chips. Also, cut clips may be withdrawn from the die holes by the picker head without any interference by using the withdrawal guiding units of the die holes.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An apparatus for bonding clips comprising:

a lead frame array comprising lead frames, to which at least one semiconductor chip is to be bonded, are arranged and spaced apart from each other by X1 and Y1 pitch interval in an X-axis direction and an Y-axis direction;

a clip array comprising a plurality of clips and tie bars, wherein the plurality of clips is arranged and spaced apart from each other by X2 and Y2 pitch interval which is smaller than any one of X1 and Y1 pitch interval in an X-axis direction and an Y-axis direction and the tie bars connect each of the plurality of clips;

a punch member comprising at least two punches and punch holders, wherein the at least two punches separate the plurality of clips into at least two individual clips by cutting the tie bars and the punch holders hold the punches;

a die member comprising at least two die holes and withdrawal guiding units, wherein the at least two die holes guide punching of the punches and the withdrawal guiding units are formed to face the inner wall surface of the die hole and are opened at a fixed angle from the lower inner wall surface, where the punches are entered, toward the upper inner wall surface; and a clip picker member comprising a multi-picker head and a picker holder, wherein the multi-picker head comprises a plurality of picker heads which respectively vacuum adsorbs individual clip separated by being entered to the die holes and vacuum releases the individual clip to be bonded to the semiconductor chips on the lead frame and the picker holder holds the multi-picker head so that at least two individual clips bonded to the picker heads are sequentially bonded to the upper surface of the semiconductor chip.

2. The apparatus of claim 1, wherein the individual clip is sequentially bonded according to X1 and Y1 pitch interval of the lead frames, when the individual clip is bonded by the clip picker member.

3. The apparatus of claim 1, wherein the punches and the die member are formed of Tungsten Carbide (TC) or SKD 11.

4. The apparatus of claim 1, wherein the punches and the die member have a hardness values that is greater than a hardness value of the clips.

5. The apparatus of claim 1, wherein the clip array further comprises a clip loading unit which winds the clip array in a reel form and provides the clip array by being arranged on punching positions by the punch member.

6. The apparatus of claim 1, wherein unit per hour UPG of clip bonding performed by the clip picker member is above 20,000.

7. The apparatus of claim 1, wherein the picker heads vertically fall down to the die holes to vacuum adsorb the individual clip, move onto the lead frame array, and vertically fall down to mount the individual clip on the upper surface of the semiconductor chips.

8. The apparatus of claim 7, wherein the clip picker member moves the individual clip from the die member to the lead frame array by motor driving.

9. The apparatus of claim 1, wherein the front end of the picker heads is entered from the upper part of the die holes and vacuum adsorbs and bonds the individual clip.

10. The apparatus of claim 1, further comprising a vision camera to identify bonding of the semiconductor chips and the individual clip.

11. The apparatus of claim 1, wherein the plurality of clips is arranged by at least two columns on the clip array.

12. The apparatus of claim 1, wherein a burr direction generated on the individual cut clip is formed toward the lead frames, when the tie bars are cut by the punches.

13. The apparatus of claim 1, wherein the front surface of the picker head, to which the clip is adsorbed, comprises at least one vacuum hole.

14. The apparatus of claim 1, wherein the die holes are formed on and penetrate the die in a hexahedral form and the withdrawal guiding units are protruded and face the inner wall surface which corresponds to a long side of the die hole.

15. A method of bonding clips comprising:

preparing a lead frame array comprising the lead frames, wherein the lead frames, to which at least one semiconductor chip is to be bonded, are arranged and spaced apart from each other by X1 and Y1 pitch interval in an X-axis direction and an Y-axis direction;

preparing a clip array comprising a plurality of clips and the tie bars, wherein the plurality of clips is arranged and spaced apart from each other by X2 and Y2 pitch interval which is smaller than any one of X1 and Y1 pitch interval in an X-axis direction and an Y-axis direction and the tie bars connect each of the plurality of clips;

separating the plurality of clips into at least two individual clips using a punch member by cutting the tie bars, wherein the punch member comprises at least two punches and punch holders that hold the punches;

guiding punching of the punches and accommodating the separated individual clip by using the die member, wherein the die member comprises at least two die holes and withdrawal guiding units which are formed to face the inner wall surface of the die hole and are opened at a fixed angle from the lower inner wall surface, where the punches are entered, toward the upper inner wall surface; and bonding the at least two individual clips attached to the picker heads sequentially to the upper surface of the semiconductor chips by using the clip picker member, wherein the clip picker member comprises a multi-picker head comprising a plurality of picker heads and a picker holder that holds the multi-picker head and thereby, respectively vacuum adsorbs individual clip separated by being entered to the die holes and vacuum releases the individual clip to the semiconductor chips on the lead frame.

16. The method of claim 15, wherein the individual clip is sequentially bonded according to X1 and Y1 pitch interval of the lead frames, when the individual clip is bonded by the clip picker member.

17. The method of claim 15, wherein the picker heads vertically fall down to the die holes to vacuum adsorb the individual clip, move onto the lead frame array, and vertically fall down to mount the individual clip on the upper surface of the semiconductor chips.

18. The method of claim 15, wherein a burr direction generated on the individual cut clip is formed toward the lead frames, when the tie bars are cut by the punches.

19. The method of claim 15, wherein the die holes are formed on and penetrate the die in a hexahedral form and the withdrawal guiding units are protruded and face the inner wall surface which corresponds to a long side of the die hole.

20. A semiconductor package comprising semiconductor chips to which clips are bonded by using the method of bonding clips of claim 15.

* * * * *